(12) United States Patent
Tang et al.

(10) Patent No.: US 7,661,058 B1
(45) Date of Patent: Feb. 9, 2010

(54) EFFICIENT RAID ECC CONTROLLER FOR RAID SYSTEMS

(75) Inventors: Heng Tang, Sunnyvale, CA (US); Zining Wu, Los Altos, CA (US); Gregory Burd, San Jose, CA (US); Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 50 days.

(21) Appl. No.: 11/736,386

(22) Filed: Apr. 17, 2007

Related U.S. Application Data

(60) Provisional application No. 60/792,492, filed on Apr. 17, 2006, provisional application No. 60/797,516, filed on May 4, 2006.

(51) Int. Cl.
*H03M 13/00* (2006.01)
(52) U.S. Cl. .................. 714/784; 714/758; 714/770
(58) Field of Classification Search .......... 714/758, 714/763, 781, 799
See application file for complete search history.

(56) References Cited

U.S. PATENT DOCUMENTS

| | | | |
|---|---|---|---|
| 4,914,656 A * | 4/1990 | Dunphy et al. ............. 714/710 |
| 5,313,585 A * | 5/1994 | Jeffries et al. .............. 711/201 |
| 5,530,996 A * | 7/1996 | Calmettes et al. ........... 24/20 R |
| 5,950,230 A | 9/1999 | Islam et al. |
| 6,052,759 A * | 4/2000 | Stallmo et al. ............. 711/114 |
| 6,282,670 B1 | 8/2001 | Islam et al. |
| 6,473,010 B1 | 10/2002 | Vityaev et al. |
| 6,961,197 B1 | 11/2005 | Burd et al. |
| 7,000,177 B1 | 2/2006 | Wu et al. |
| 7,072,417 B1 | 7/2006 | Burd et al. |
| 2006/0117217 A1 | 6/2006 | Chien et al. |

OTHER PUBLICATIONS

Minsky, Henry; Introduction to Reed Solomon Codes; http://www.beartronics.com/rscode.sourceforge.net/rs.html; Sep. 19, 2006; 2 pages.
Integer-Input RS Encoder; http://www.mathworks.com/access/helpdesk/help/toolbox/ commblks/ref/integerinputrsencoder.html; Sep. 19, 2006; 4 pages.
Data Formats for Block Coding; http://www.mathworks.com/access/helpdesk/help/toolbox/commblks/ug/fp62867.html; Sep. 19, 2006; 2 pages.
Litwin, Louis; "Error control coding in digital communications systems"; http://rfdesign.com/mag/radio_error_control_coding/index.html; Jul. 1, 2001; 7 pages.
Plank, James S.; "A Tutorial on Reed-Solomon Coding for Fault-Tolerance in RAID-like Systems"; Technical Report CS-96-332; Sep. 1997; 19 pages.
Plank, James S. et al; "Note: Correction to the 1997 Tutorial on Reed-Solomon Coding"; Technical Report UT-CS-03-504; Apr. 24, 2003 pages.

* cited by examiner

*Primary Examiner*—Esaw T Abraham

(57) ABSTRACT

A Redundant Array of Inexpensive Disks (RAID) controller comprises a RAID error correction code (ECC) encoder module that receives data for storage and that generates code words for data drives and one or more parity drives, which have physical locations. The code words are generated based on the data and a cyclic code generator polynomial. The logical locations correspond to index positions in the cyclic code generator polynomial. A mapping module maps the physical locations of the data and parity drives to the logical locations. When one of the data drives is removed, the mapping and RAID ECC encoder modules do not modify the map.

31 Claims, 10 Drawing Sheets

EFFICIENT RAID ECC CONTROLLER FOR RAID SYSTEMS

CROSS-REFERENCE TO RELATED APPLICATIONS

This application claims the benefit of U.S. Provisional Application No. 60/792,492, filed on Apr. 17, 2006 and U.S. Provisional Application No. 60/797,516, filed on May 4, 2006. The disclosures of the above applications are incorporated herein by reference in their entirety.

FIELD

The present disclosure relates generally to a redundant array of inexpensive disks (RAID) system, and more particularly to systems and methods for efficiently adding and removing drives in a RAID system.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Performance in microprocessor and semiconductor memory technology continues to increase at a rapid pace. Drive storage technology has typically not kept pace. Redundant arrays of inexpensive disks (RAID) have been used to improve the data transfer rate and data input/output (I/O) rate over other types of disk access. RAID systems also provide greater data reliability at a low cost.

A RAID system distributes storage over multiple drives. When one of the drives fails, a RAID controller performs data recovery. It may also be desirable to add or remove a drive from the RAID system. The RAID system typically uses one or more parity drives to store error-correcting parity information and a plurality of data drives that store user information. If a data drive fails, the contents of the failed drive can be reconstructed using the information from the remaining data drives and the parity drive(s).

Each drive in a RAID system may generate its own Error Correction Code (ECC) and cyclic redundancy code (CRC). In addition, another layer of ECC may be added across the drives in the RAID system to handle drive failures.

Referring now to FIGS. 1 and 2, the structure of RAID system is shown in further detail. In FIG. 1, a storage system 10 includes data drives 12 $d_1$-$d_k$ and parity drives 14 $p_1$-$p_r$. The number of data drives k may be different than the number of parity drives r. The data drives 12 and parity drives 14 communicate via a bus 16. The bus 16 may also communicate with a RAID control module 18.

The RAID control module 18 may include a RAID ECC encoder 20 and a RAID ECC decoder 22. The RAID control module 18 communicates with a system 24 such as a computer or a network of computers. The data storage system 10 stores and retrieves user information on the data drives 12. The RAID control module 18 generates ECC redundancy that is stored on the parity drives 14. The RAID control module 18 may use a cyclic code such as Reed Solomon (RS) ECC.

Let $s_i(j)$ be the user data corresponding to the Logical Block Address (LBA) j on the $i^{th}$ data drive in the RAID system. The data bits in $s_i(j)$ may be grouped into symbols if a non-binary ECC is used. A RAID ECC code word is formed by associating corresponding symbols across all of the data drives, i.e. $w(j,l)=(s_0(j,l), s_1(j,l), \ldots, s_{k-1}(j,l))$, where $l=0, 1, \ldots L-1$ enumerates RAID ECC symbols within $s_i(j)$.

To recover one sector on a failed drive, the RAID control module 18 carries out L ECC decoding operations (one for each symbol). For example, if individual drives forming a RAID system have 0.5 K byte sector format, and RAID ECC operates on a byte level (e.g. RAID ECC is RS ECC over $GF(2^8)$), then there are 512 RAID RS ECC codewords per each sector of a fixed component drive.

One simple example is a RAID system including two drives, where RAID ECC utilizes (2,1) repetition code. Consequently, both drives contain the same information. If the first drive (data drive) fails, then the second drive (parity drive) can be used to restore lost information.

Another exemplary of RAID system can employ Single Parity Bit Code-based ECC. For example, a RAID system may include k user drives and 1 parity drive (e.g. k=10). Let $s_i(j)$ denote the sector from i-th drive corresponding to LBA=j. The RAID ECC encoder ensures that $s_0(j)+s_1(j)+ \ldots +s_{10}(j)=0$ for all possible LBA values j (here "+" refers to bitwise XOR operation, and 0 represents a sector long zero vector). If only one out of 11 drives fails, for example drive 0, then the lost data can be reconstructed from the other drives via $s_0(j)=s_1(j)+ \ldots +s_{10}(j)$ for all valid LBA values j.

Referring now to FIG. 3, exemplary logical and physical locations of a RAID system 50 including twelve drives is illustrated. The RAID system may include four parity drives. Let $s_i(j,l)$ represent the l-th symbol of a sector with LBA=j written on the i-th drive. Then $s_0(j,l), s_1(j,l), \ldots, s_{11}(j,l)$ form the RS ECC codeword for all values of j and k.

The physical location of the drives within a RAID system 56 is illustrated with numerals 0-11. Arrows 58 illustrate the mapping between physical drive locations 0-11 and logical drive locations $52^0$-$52^{11}$, where logical drive location corresponds to an index of RS ECC codeword.

For example, the drive with physical location 10 stores a $1^{st}$ symbol of each RAID RS ECC codeword. More locations may be added or removed when the requirements of the RAID system change. It is desirable to allow the RAID system to expand (add new data or parity drives) or contract (remove data or parity drives) without having to take the system offline for prolonged periods of time to perform maintenance.

Referring now to FIG. 4, when one of the drives is removed, the code length is changed. In this approach, the physical-to-logical map is changed. In step 100, the physical-to-logical map for a particular group of drives is determined. The order of logical locations does not necessarily correspond to the order of physical locations of each of the drives. In step 102, the code words are generated and saved to the drives in stripes. Code words for both the data and parity drives are generated. In step 104, the code words are stored on the data and parity drives.

In step 110, the system determines whether a data drive needs to be removed. This may or may not be due to drive errors. In step 112, logical locations of the data that are greater than the logical location of the removed drive are mapped toward lower-degree logical positions to remove a gap. By shifting the logical locations, a second map (physical-to-logical) is created. The logical locations in the second map have consecutive low-degree positions occupied. In step 114, the data drives are read and the code words for the data drives are generated. In step 116, the parity part of second code word is written to the parity drive(s).

When drives are later added to the RAID system, they are assigned a highest degree logical position. All of the drives are read and the parity drives are written.

Using the approach described above requires a read operation on all of the data drives and a write of the parity drives when adding, removing or modifying drives. This can reduce the amount of uptime of the RAID system.

SUMMARY

A Redundant Array of Inexpensive Disks (RAID) controller comprises a RAID error correction code (ECC) encoder module that receives data for storage and that generates code words for data drives and one or more parity drives, which have physical locations. The code words are generated based on the data and a cyclic code generator polynomial. Logical locations correspond to index positions in the cyclic code generator polynomial. A mapping module generates a map of the physical locations of the data and parity drives to the logical locations. When one of the data drives is removed, the mapping and RAID ECC encoder modules do not modify the map.

In other features, the cyclic code generator polynomial generates Reed Solomon code. The RAID ECC encoder module is configured in erasure decoding mode. Before one of the data drives is removed, the RAID ECC encoder module reads the one of the data drives. A difference generating module generates a difference code word based on the removed data drive. The RAID ECC encoder adds the difference code word to an original code word generated before the removed data drive is removed. When the removed data drive is removed, the RAID ECC encoder module assigns a zero to a logical location in the code word corresponding to the removed data drive, modifies the parity drives and does not read other ones of the data drives.

In other features, a RAID system comprises the RAID controller. K data drives each include an ECC/cyclic redundancy check (CRC) module that performs ECC and CRC, where K is an integer greater than one. R parity drives each include an ECC/CRC module that performs ECC and CRC, where R is an integer greater than zero. The mapping module maps the parity drives to lowest positions in the index.

In other features, the RAID ECC encoder module is configured to handle a maximum number of data drives k_max and to have a maximum correction power t_max. A RAID ECC decoder module decodes the code words.

A Redundant Array of Inexpensive Disks (RAID) controller comprises RAID error correction code (ECC) encoder means for receiving data for storage and for generating code words for data drives and one or more parity drives, which have corresponding physical locations. The code words are generated based on the data and a cyclic code generator polynomial. Logical locations correspond to an index of the cyclic code generator polynomial. Mapping means generates a map of the physical locations of the data and parity drives to the logical locations. When one of the data drives is removed, the mapping and RAID ECC encoder means do not modify the map.

In other features, the cyclic code generator polynomial generates Reed Solomon code. The RAID ECC encoder means is configured in erasure decoding mode. Before one of the data drives is removed, the RAID ECC encoder means reads the one of the data drives. Difference generating means generates a difference code word based on the removed data drive. The RAID ECC encoding means adds the difference code word to an original code word generated before the removed drive is removed. When the removed drive is removed, the RAID ECC encoder means assigns a zero to a logical location in the code word corresponding to the removed data drive, modifies the parity drives and does not read other ones of the data drives.

In other features, a RAID system comprises the RAID controller. K data drives each include ECC/cyclic redundancy check (CRC) means for performing ECC and CRC, where K is an integer greater than one. R parity drives each include ECC/CRC means for performing ECC and CRC, where R is an integer greater than zero. The mapping means maps the parity drives to lowest positions in the index. The RAID ECC encoder means is configured to handle a maximum number of data drives k_max and to have a maximum correction power t_max. RAID ECC decoding means decodes the code words.

A method for operating Redundant Array of Inexpensive Disks (RAID) controller comprises receiving data for storage and generating code words for data drives and one or more parity drives, which have corresponding physical locations, wherein the code words are generated based on the data and a cyclic code generator polynomial, and wherein logical locations correspond to an index of the cyclic code generator polynomial; generating a map of the physical locations of the data and parity drives to the logical locations; and leaving the index of the logical locations in the cyclic code generator polynomial unmodified when one of the data drives is removed.

In other features, the cyclic code generator polynomial generates Reed Solomon code. The Reed Solomon coding is performed in erasure decoding mode. The method includes reading one of the data drives before the one of the data drives is removed. The method includes generating a difference code word based on the removed data drive. The method includes adding the difference code word to an original code word generated before the removed data drive is removed. When the removed drive is removed, the method includes assigning a zero to a logical location in the code word corresponding to the removed data drive; modifying the parity drives; and not reading other ones of the data drives. The method includes performing ECC and CRC on the data and parity drives. The method includes mapping the parity drives to lowest positions in the index.

A computer method stored on a medium for use by a processor for operating Redundant Array of Inexpensive Disks (RAID) controller comprises receiving data for storage and generating code words for data drives and one or more parity drives, which have corresponding physical locations, wherein the code words are generated based on the data and a cyclic code generator polynomial, and wherein logical locations correspond to an index of the cyclic code generator polynomial; generating a map of the physical locations of the data and parity drives to the logical locations; and leaving the index of the logical locations in the cyclic code generator polynomial unmodified when one of the data drives is removed.

In other features, the cyclic code generator polynomial generates Reed Solomon code. The Reed Solomon coding is performed in erasure decoding mode. The computer method includes reading one of the data drives before the one of the data drives is removed. The computer method includes generating a difference code word based on the removed data drive. The computer method includes adding the difference code word to an original code word generated before the removed data drive is removed. When the removed drive is removed, the computer method includes assigning a zero to a logical location in the code word corresponding to the removed data drive; modifying the parity drives; and not reading other ones of the data drives. The computer method includes performing ECC and CRC on the data and parity drives. The computer method includes mapping the parity drives to lowest positions in the index.

A Redundant Array of Inexpensive Disks (RAID) controller comprises a RAID error correction code (ECC) encoder module that receives data for storage and that generates code words stored by data drives and one or more parity drives, which have physical locations. The code words are generated based on the data and a cyclic code generator polynomial. Logical locations correspond to an index of the cyclic code generator polynomial. A mapping module generates a map of the physical locations of the data and parity drives to the logical locations. A difference generating module generates a difference code word when data on one of the data drives is modified, wherein the RAID ECC encoder module encodes the difference code word and adds the encoded difference code word to an original code word generated before the modification.

In other features, the cyclic code generator polynomial generates Reed Solomon code. The RAID ECC encoder module is configured in erasure decoding mode. A RAID system comprises the RAID controller, K data drives each including an ECC/cyclic redundancy check (CRC) module that performs ECC and CRC, where K is an integer greater than one, and R parity drives each including an ECC/CRC module that performs ECC and CRC, where R is an integer greater than zero.

In other features, the mapping module maps the parity drives to lowest ones of the index. The RAID ECC encoder module is configured to handle a maximum number of data drives k_max. The RAID ECC encoder module is configured to have a maximum correction power t_max. A RAID ECC decoder module decodes the code words.

A Redundant Array of Inexpensive Disks (RAID) controller comprises RAID error correction code (ECC) encoder means for receiving data for storage and for generating code words for data drives and one or more parity drives, which have physical locations. The code words are generated based on the data and a cyclic code generator polynomial. Logical locations correspond to an index of the cyclic code generator polynomial. Mapping mean maps the physical locations of the data and parity drives to the logical locations. Difference generating means generates a difference code word when data on one of the data drives is modified, wherein the RAID ECC encoder means encodes the difference code word and adds the encoded difference code word to an original code word before the modification.

In other features, the cyclic code generator polynomial generates Reed Solomon code. The RAID ECC encoder means is configured in erasure decoding mode. A RAID system comprises the RAID controller, K data drives each including ECC/cyclic redundancy check (CRC) means for performing ECC and CRC, where K is an integer greater than one, and R parity drives each including ECC/CRC means for performing ECC and CRC, where R is an integer greater than zero.

In other features, the mapping means maps the parity drives to lowest positions in the index. The RAID ECC encoder means is configured to handle a maximum number of data drives k_max and to have a maximum correction power t_max. RAID ECC decoding means decodes the code words.

A method for operating a Redundant Array of Inexpensive Disks (RAID) controller comprises receiving data for storage; generating code words for data drives and one or more parity drives, which have physical locations; generating the code words based on the data and a cyclic code generator polynomial, wherein logical locations correspond to an index of the cyclic code generator polynomial; mapping the physical locations of the data and parity drives to the logical locations; generating a difference code word when data on one of the data drives is modified; and encoding the difference code word and adding the encoded difference code word to an original code word before the modification.

In other features, the cyclic code generator polynomial generates Reed Solomon code. The Reed Solomon code is configured in erasure decoding mode. The method includes mapping the parity drives to lowest positions in the index. The method includes configuring the RAID controller to handle a maximum number of data drives k_max and to have a maximum correction power t_max. The method includes decoding the code words.

A computer method stored on a medium for use by a processor for operating a Redundant Array of Inexpensive Disks (RAID) controller comprises receiving data for storage; generating code words for data drives and one or more parity drives, which have physical locations; generating the code words based on the data and a cyclic code generator polynomial, wherein logical locations correspond to an index of the cyclic code generator polynomial; mapping the physical locations of the data and parity drives to the logical locations; generating a difference code word when data on one of the data drives is modified; and encoding the difference code word and adding the encoded difference code word to an original code word before the modification.

In other features, the cyclic code generator polynomial generates Reed Solomon code. The Reed Solomon code is configured in erasure decoding mode. The computer method includes mapping the parity drives to lowest positions in the index. The computer method includes configuring the RAID controller to handle a maximum number of data drives k_max and to have a maximum correction power t_max. The computer method includes decoding the code words.

A Redundant Array of Inexpensive Disks (RAID) controller comprises a RAID error correction code (ECC) encoder module that receives data for storage and that generates code words for data drives and one or more parity drives, which have physical locations. The code words are generated based on the data and a cyclic code generator polynomial. Logical locations correspond to index positions in the cyclic code generator polynomial. A mapping module maps the physical locations of the data and parity drives to the logical locations. The mapping module adds a new data drive to an unused one of said logical locations. A difference generating module generates a difference code word based on the new data drive. The RAID ECC encoder module encodes the difference code word and adds the encoded difference code word to an original code word generated before the new data drive is added.

In other features, the cyclic code generator polynomial generates Reed Solomon code. The RAID ECC encoder module is configured in erasure decoding mode. A RAID system comprises the RAID controller, K data drives each including an ECC/cyclic redundancy check (CRC) module that performs ECC and CRC, where K is an integer greater than one, and R parity drives each including an ECC/CRC module that performs ECC and CRC, where R is an integer greater than zero.

In other features, the mapping module maps the parity drives to lowest positions in the index. The RAID ECC encoder module is configured to handle a maximum number of data drives k_max and to have a maximum correction power t_max. A RAID ECC decoder module decodes the code words.

A Redundant Array of Inexpensive Disks (RAID) controller comprises RAID error correction code (ECC) encoder means for receiving data for storage and for generating code words for data drives and one or more parity drives, which have physical locations. The code words are generated based on the data and a cyclic code generator polynomial. Logical locations correspond to index positions in the cyclic code generator polynomial. Mapping means maps the physical locations of the data and parity drives to the logical locations. The mapping means adds a new data drive to an unused one of said logical locations. Difference generating means generates a difference code word based on the new data drive. The RAID ECC encoder means encodes the difference code word and adds the encoded difference code word to an original code word generated before the new data drive is added.

In other features, the cyclic code generator polynomial generates Reed Solomon code. The RAID ECC encoder means is configured in erasure decoding mode. A RAID system comprises the RAID controller, K data drives each including ECC/cyclic redundancy check (CRC) means for performing ECC and CRC, where K is an integer greater than one, and R parity drives each including ECC/CRC means for performing ECC and CRC, where R is an integer greater than zero. The mapping means maps the parity drives to lowest positions in the index. The RAID ECC encoder means is configured to handle a maximum number of data drives k_max and to have a maximum correction power t_max. RAID ECC decoder means decodes the code words.

A method for operating a Redundant Array of Inexpensive Disks (RAID) controller comprises receiving data for storage; generating code words for data drives and one or more parity drives, which have physical locations; generating the code words based on the data and a cyclic code generator polynomial, wherein logical locations correspond to index positions in the cyclic code generator polynomial; mapping the physical locations of the data and parity drives to the logical locations; adding a new data drive to an unused one of said logical locations; generating a difference code word based on the new data drive; encoding the difference code word; and adding the encoded difference code word to an original code word generated before the new data drive is added.

In other features, the cyclic code generator polynomial generates Reed Solomon code. The Reed Solomon code is configured in erasure decoding mode. The method includes mapping the parity drives to lowest positions in the index.

A computer method stored on a medium for use by a processor for operating a Redundant Array of Inexpensive Disks (RAID) controller comprises receiving data for storage; generating code words for data drives and one or more parity drives, which have physical locations; generating the code words based on the data and a cyclic code generator polynomial, wherein logical locations correspond to index positions in the cyclic code generator polynomial; mapping the physical locations of the data and parity drives to the logical locations; adding a new data drive to an unused one of said logical locations; generating a difference code word based on the new data drive; encoding the difference code word; and adding the encoded difference code word to an original code word generated before the new data drive is added.

In other features, the cyclic code generator polynomial generates Reed Solomon code. The Reed Solomon code is operated in erasure decoding mode. The computer method includes mapping the parity drives to lowest positions in the index.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings.

DETAILED DESCRIPTION

Figure 1:
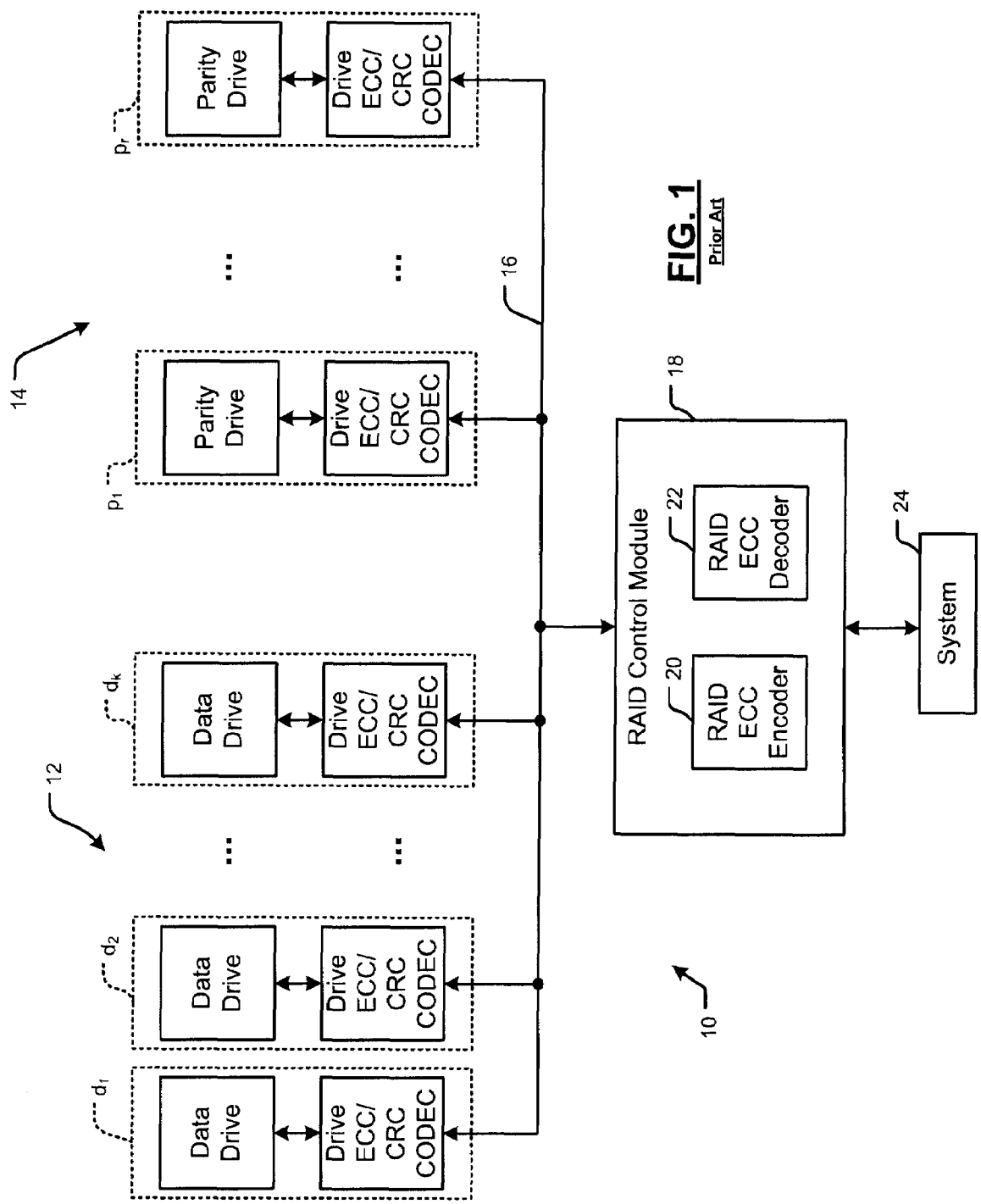
FIG. 1 is a block diagrammatic view of a RAID system according to the prior art.
Figure 2:
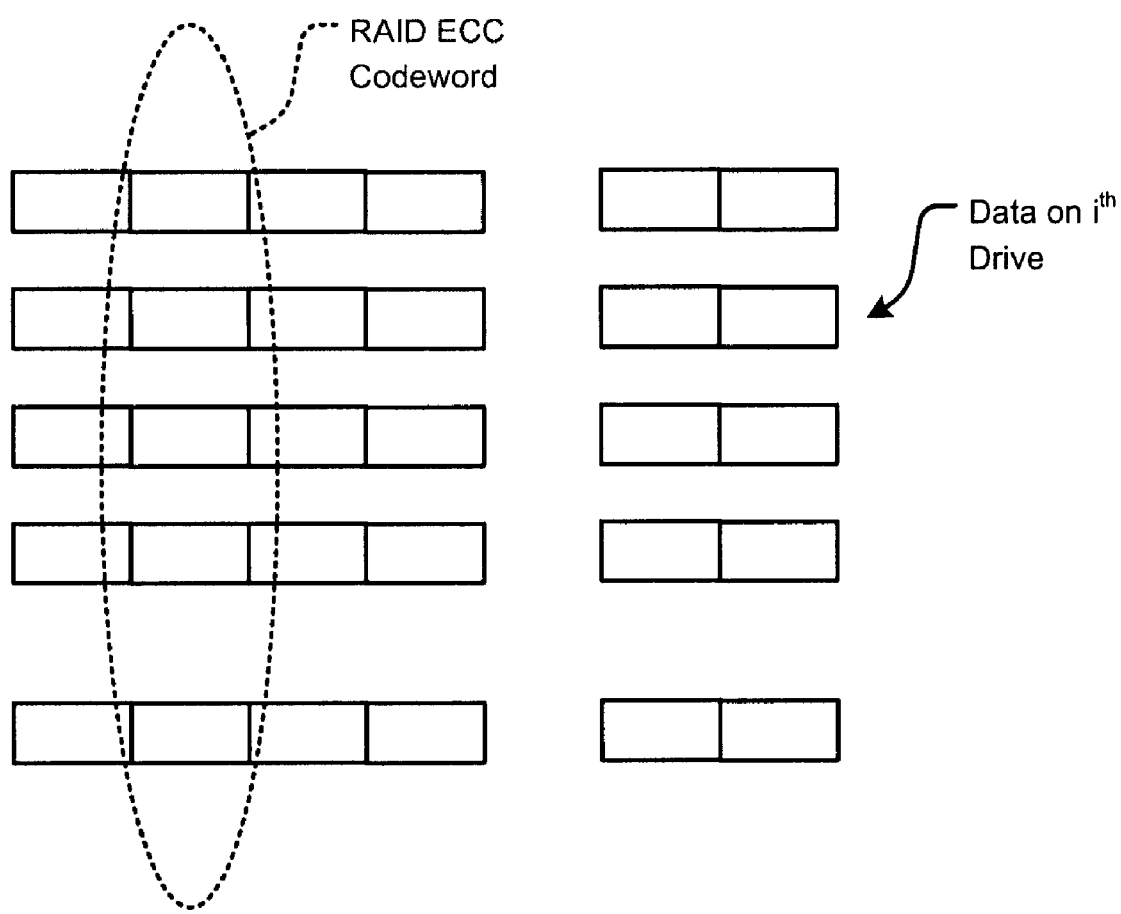
FIG. 2 illustrates RAID ECC codewords and data on drives according to prior art.
Figure 3:
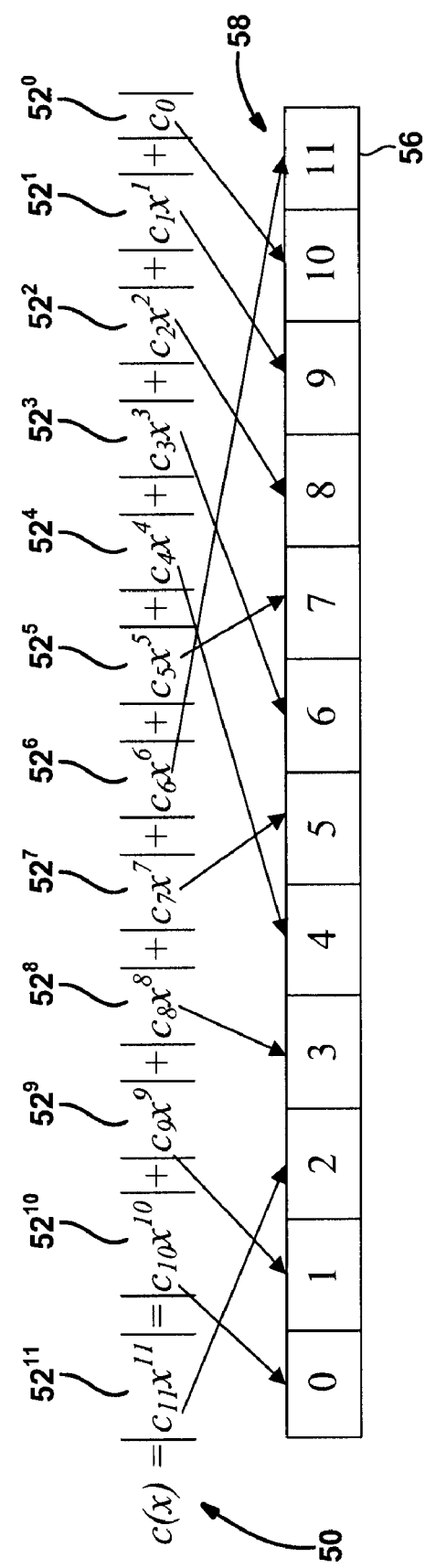
FIG. 3 is illustrates an exemplary logical to physical mapping of drives.

The following description is merely exemplary in nature and is in no way intended to limit the disclosure, its application, or uses. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

To allow relatively seamless removal of drives, the present disclosure maintains the logical-to-physical mapping during drive removal. Artificial zeros are assigned to removed positions associated with the removed drive. In other words, the cyclic code generator polynomial remains unchanged when the drives are added and removed.

The system may be configured with predefined maximum parameters. For example, a maximum number of data drives k_max and a maximum desired RAID correction power t_max can be specified. The RAID system can be operated with fewer data and parity drives than the maximum. Drives can be added as long as the maximum number of drives is not exceeded.

The cyclic code generator polynomial may include a Reed Solomon (RS) code generator polynomial. The RAID RS ECC may be operated in erasure mode only. In other words, one of the drives has failed and therefore the "correction power" coincides with RS ECC redundancy count.

The RAID RS ECC encoder may encode to the maximum correction power. The number of parity drives may be greater than or equal to one and less than t_max. In this case, some of the RS ECC redundancies are dropped and are treated as erasures by the decoder. This configuration allows flexible correction power without adding additional complexity to the RAID RS ECC encoder and decoder to support multiple RS ECC codes corresponding to various levels of correction power.

This RS ECC configuration allows relatively seamless removal of parity drives. In other words, the corresponding RS ECC symbol in each RAID ECC codeword may be marked as an erasure.

Figure 5:
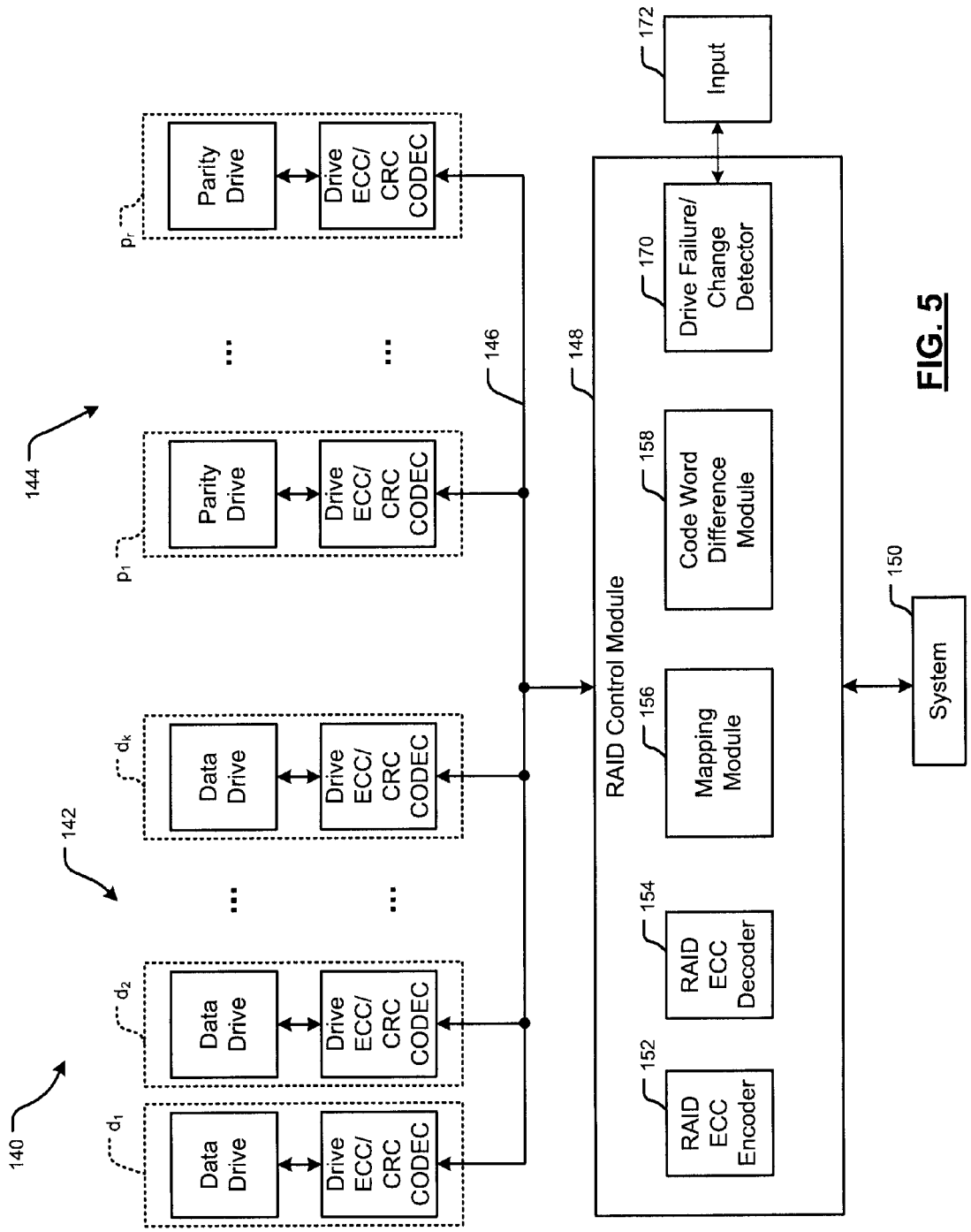
FIG. 5 is a block diagrammatic view of the RAID controller according to the present disclosure.

Referring now to FIG. 5, a data storage system 140 includes data drives 142 $d_1$-$d_k$ and parity hard drives 144 $p_1$-$p_r$. The number of data drives k may be different than the number of parity drives r. The drives may perform ECC and CRC at the drive level as described above. The data drives 142 and parity drives 144 communicate via a bus 146. The bus 146 also communicates with a RAID control module 148, which communicates with a system 150, such as a computer or a network of computers.

The RAID control module 148 includes a RAID ECC encoder module 152, a RAID ECC decoder module 154, a mapping module 156, a code word difference module 158 and a drive failure/change detector module 170. The RAID ECC encoder module 152 generates ECC redundancy corresponding to the information contained in the array of drives 12 and forms code words in response to a code generator polynomial. The generator polynomial may be a cyclic code generator polynomial such as a Reed-Solomon code generator polynomial.

The RAID ECC decoder module 154 recovers the data when a drive failure occurs. The RAID ECC encoder module 152 and the RAID ECC decoder module 154 can be combined into a single module.

The mapping module 156 determines the mapping between logical locations and physical locations of the data. The logical locations of data may be referenced to index positions of data in a cyclic (such as RS) code word of length k+r. This mapping may change as needed. The code word difference module 158 determines a difference between two code words.

The drive failure/change detector module 170 determines whether a change in the arrays 12, 14 is being performed or is about to be performed. The change may include identifying drive failures, removing a data or parity drive, inserting a new data or parity drive, or modifying a data drive. An input device 172 may provide data relating to an impending change so that data from the drive may optionally be read before the change takes place.

Figure 6:
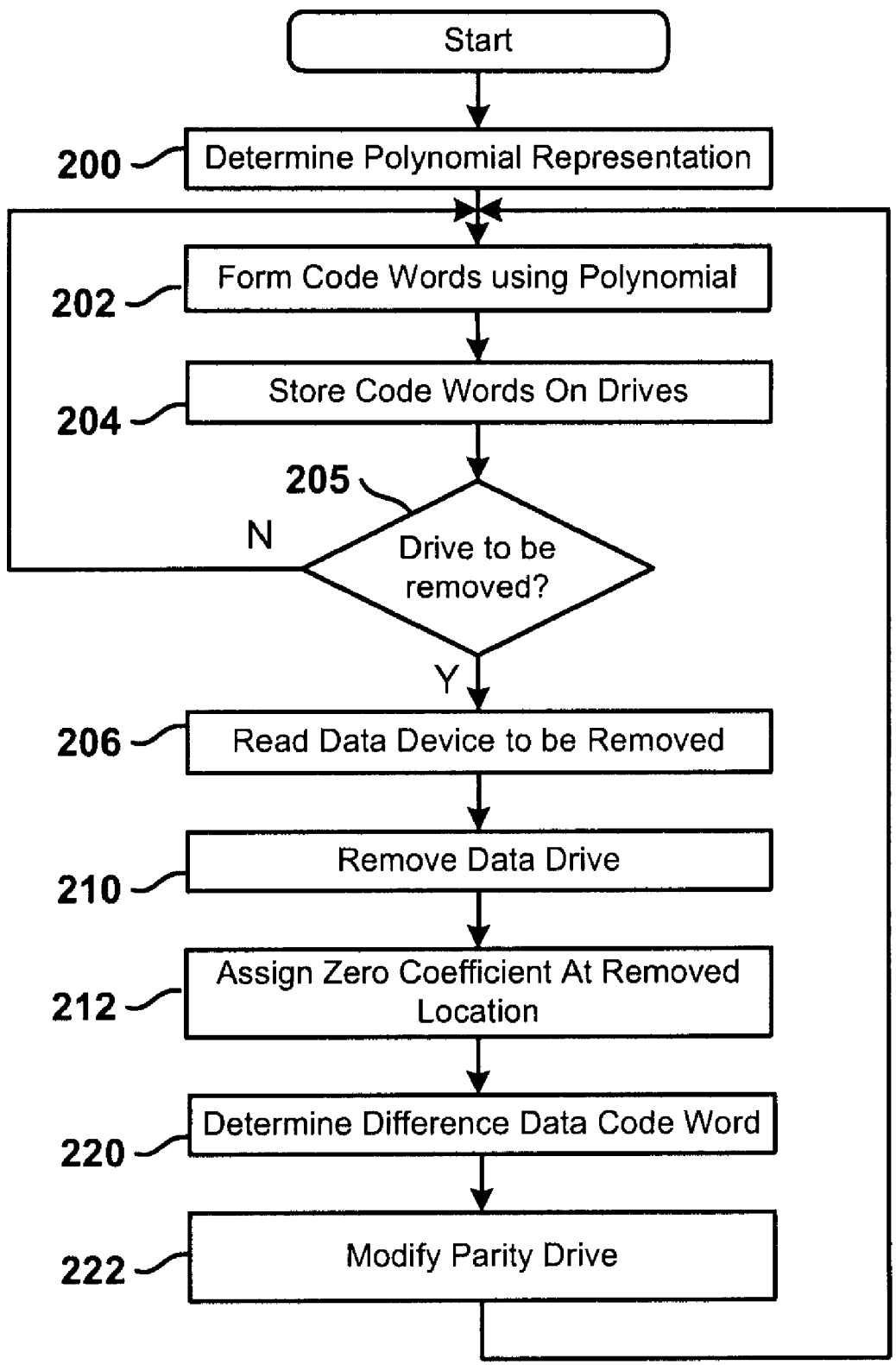
FIG. 6 is flowchart of a method/architecture for removing a data drive according to the present disclosure.

Referring now to FIG. 6, a method for removing a hard drive and changing the code word according to the present disclosure is shown. Steps 200, 202 and 204 are similar to steps 100, 102 and 104 and, therefore, will not be discussed further. In this approach, the physical-to-logical mapping does not change when a data drive is removed. As a result, except for the removed drive, the remaining drives do not need to be read and there is no down-time for the remaining data drives. In step 205, control determines whether a drive needs to be removed.

In step 206, the removed data drive is read. In step 210, the data drive is removed. In step 212, a zero is assigned to the logical location corresponding to the removed drive. In step 220, a difference codeword is generated.

As mentioned above, a first set of code words is determined as:

$(d_1, \ldots d_i, \ldots d_k, p_1, p_2, \ldots, p_{n-k})$

The new code word for the system is:

$(d_1, \ldots d_i^*, \ldots, d_k, p_1^*, p_2^*, \ldots, p_{n-k}^*)$.

The difference code word is, thus, set forth as:

$(0, 0, \Delta d_i, 0, 0, \ldots 0, \Delta p_1, \Delta p_2, \ldots, \Delta p_{n-k})$ Where:

$\Delta d_i = d_i + d_i^*, \quad \Delta p_1 = p_1 + p_1^*, \quad \Delta p_2 = p_2 + p_2^*, \ldots,$
$\Delta p_{n-k} = p_{n-k} + p_{n-k}^*$ In step 222, the parity drives are modified in response to the difference code word.

This approach avoids reading all of the data drives during drive removal. This approach reads the information from the drive that is being removed, followed by read/write operation on the parity drives.

Let $(d_1, \ldots d_i, \ldots, d_k, p_1, p_2, \ldots, p_{n-k})$ be the current value of an RAID ECC codeword, and further assume that symbol $d_i$ comes the $i^{th}$ drive that is marked for removal. The RAID control module 148 forms new ECC word $(0, 0, d_i, 0, 0, \ldots 0)$ and proceeds to encode it to form "difference" RS ECC codeword $(0, 0, d_i, 0, 0, \ldots 0, p_0^*, \ldots, p_{n-k}^*)$. Adding the original ECC codeword to the difference ECC codeword produces another ECC codeword $(d_1, d_{i-1}, 0, d_{i+1} \ldots, d_k, p_1+p_1^*, p_2+p_2^*, \ldots, p_r+p_r^*)$, which has desired values corresponding to the data drives. Furthermore, note that the symbol corresponding to the $i^{th}$ drive is now 0 as desired since it is being removed. The original parity values, say p1, is updated by $p_1+p_1^*$.

Figure 7:
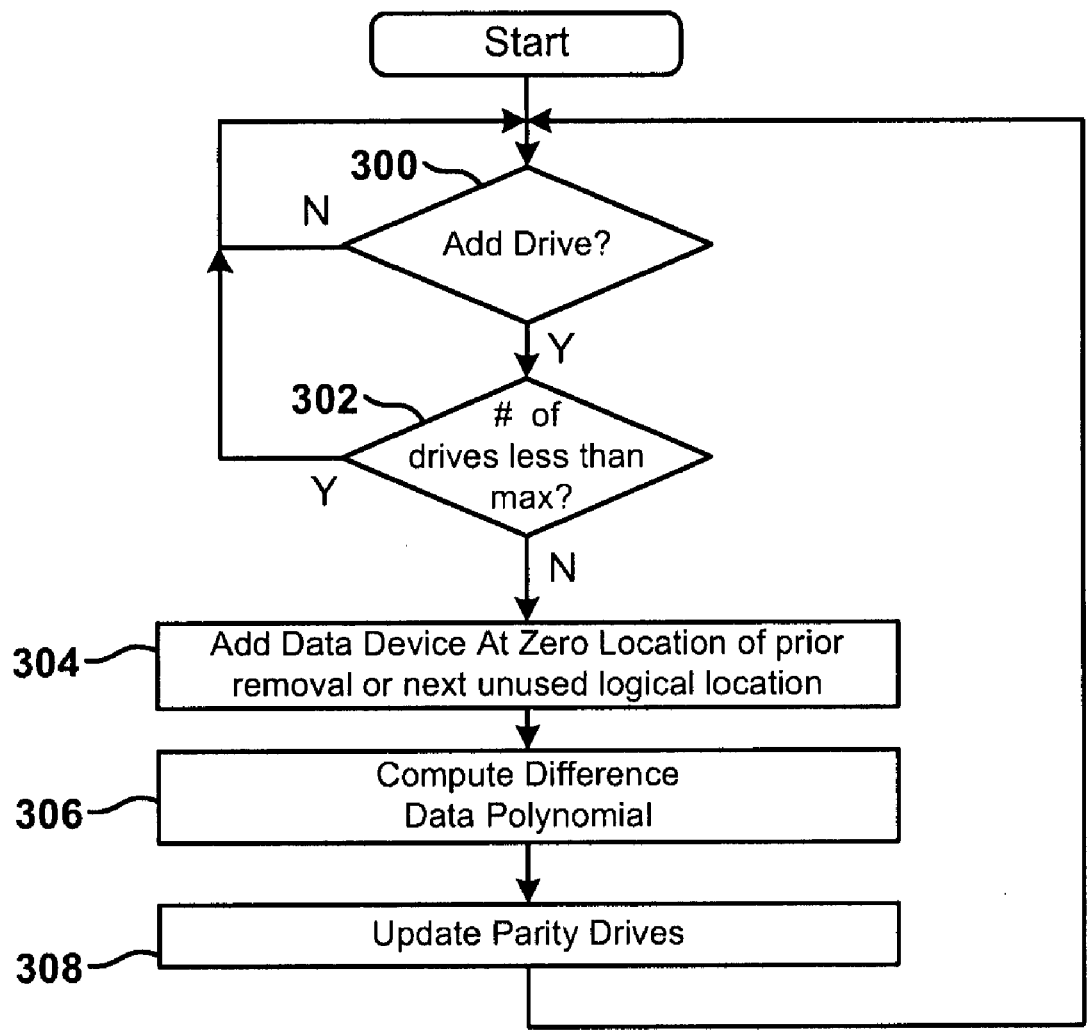
FIG. 7 is a flowchart for adding a data drive according to the present disclosure.

The operation of adding new data drives to the RAID system of FIGS. 6 and 7 is described below. The algorithm is similar to that used for drive removal. To insert new drive, the number of data drives needs to be less than the maximum possible k_max. If the RAID system is not full, one of the drive slots has a symbol zero in each RAID ECC codeword.

Without loss of generality, assume that the $i^{th}$ logical slot is not used. In other words, the current RAID ECC codeword has the form $(d_1, \ldots, d_{i-1}, 0, d_{i+1} \ldots, d_k, p_1, p_2, \ldots, p_r)$ RAID control module forms new ECC word $(0, 0, d_i, 0, 0, \ldots 0)$ and proceeds to encode it to form "difference" RS ECC codeword $(0, 0, d_i, 0, 0, \ldots 0, p_0^*, p_1^*, \ldots, p_r^*)$. Adding the original ECC codeword to the difference ECC codeword produces another ECC codeword $(d_1, \ldots d_{i-1}, d_i, d_{i+1} \ldots, d_k, p_1+p_1^*, p_2+p_2^*, \ldots, p_r+p_r^*)$, that has desired values corresponding to data drives.

Referring now to FIG. 7, a method for adding a drive is set forth. The physical-to-logical mapping is not changed and the insertion position keeps its old logical location (not necessarily the highest degree location). In step 300, control determines whether a new drive is being added. If step 300 is true, control determines whether the number of drives is less than a maximum number of drives k_max in step 302. If step 302 is false, a new data drive is added at a zero location previously set to zero or a next unused logical position in step 304. In step 306, a difference code word is determined in a similar manner to that set forth above. In step 308, the parity drives are updated using the difference code word.

Figure 4:
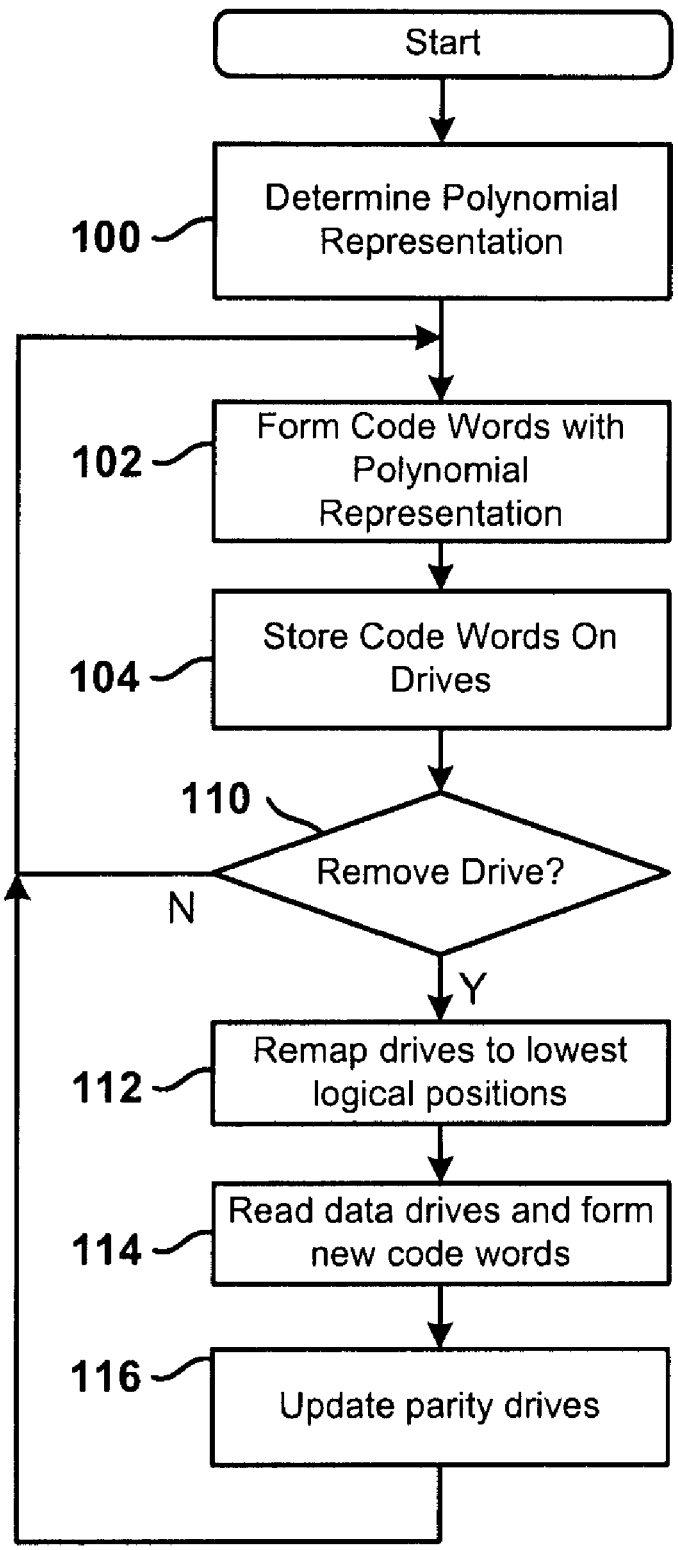
FIG. 4 is a flowchart of a first method/architecture for removing a data drive according to the prior art.
Figure 8:
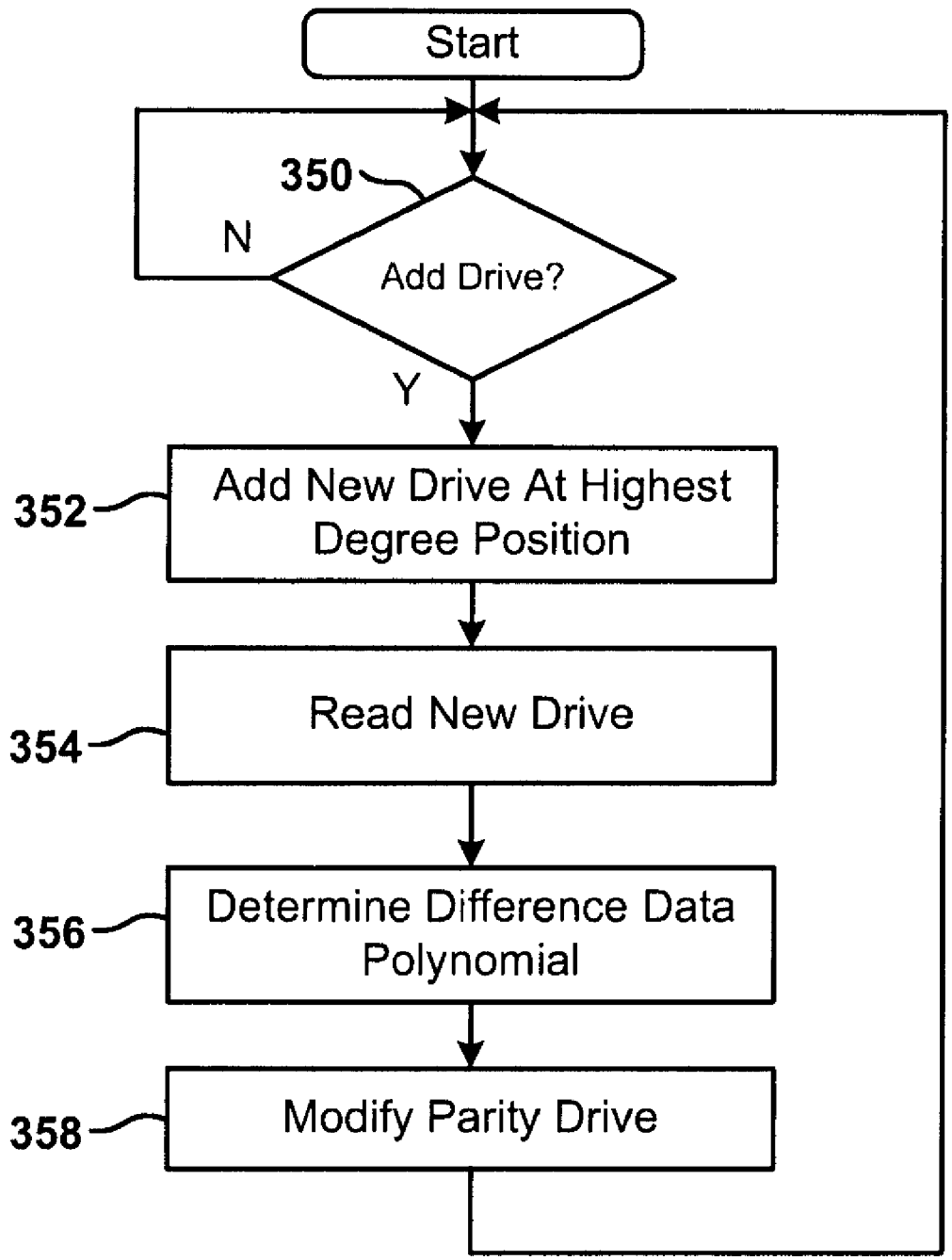
FIG. 8 is a flowchart of a method/architecture of adding a data drive according to the prior art.

Referring now to FIG. 8, a method for adding a new hard drive to the system described in FIG. 4 is set forth. As was previously described above, when a new drive is added to the RAID system of FIG. 4, the conventional system reads all of the data disks, generates new code words and writes parity.

A similar difference generating technique is used to reduce downtime. The location mapping of the data is changed by adding one more location to the highest degree location. In step 350, control determines whether a new drive is to be added. In step 352, a new drive is added to a physical location, which is mapped to the highest degree position in the logical locations of the code word. In step 354, the new data drive is read. In step 356, a difference code word is generated. In step 358, the parity drive(s) is/are modified in response to the difference code word.

Figure 9:
FIG. 9 is a table illustrating comparing operations of the method/architectures described herein.

Referring now to FIG. 9, a table illustrating the difference between the methods of FIGS. 4 and 7 is illustrated. The table 500 has two rows corresponding to FIG. 4 and FIG. 6. The first column is code length. In FIG. 4, the code length is changed by moving the logical locations toward the low degree position. As can be seen, the removed data drive does not have to be read while the remaining drives are read. The parity drives are written in FIG. 4. In FIG. 7, the removed data drives are read and the remaining drives are not read. The parity drives are read and written.

Figure 10:
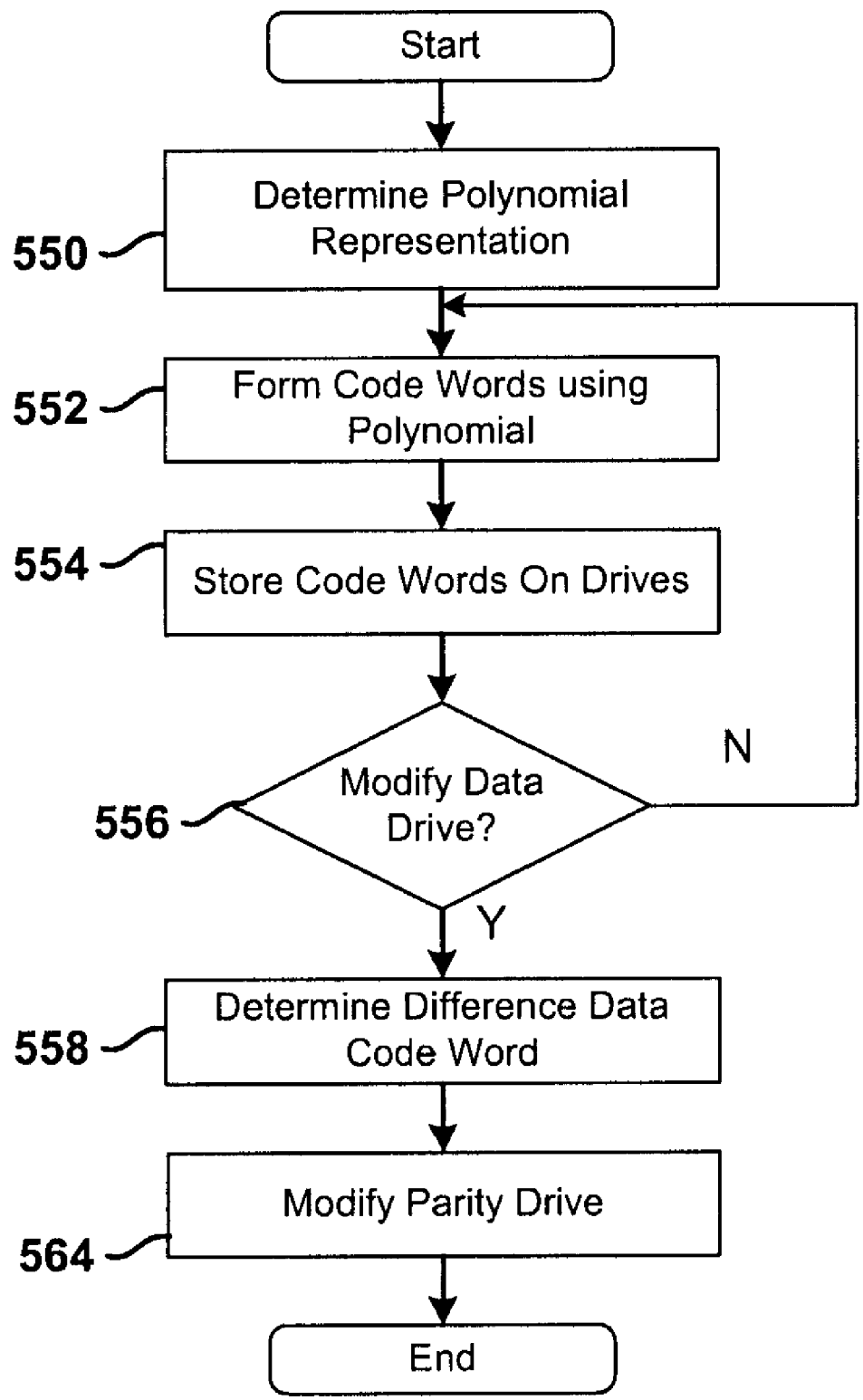
FIG. 10 is a flowchart of a method/architecture of modifying a data drive.

Referring now to FIG. 10, another embodiment of the disclosure is set forth. In this embodiment, one of the plurality of the hard data drives is modified. In this case, the mapping from physical to logical locations remains unchanged.

In step 550, the polynomial representation is determined. In step 552, the code words are formed and saved to the disks in stripes. In step 554, the first code words are stored on the various drives. In step 556, control determines whether a data drive in the system needs to be modified. In step 558, a difference code word is determined in code word difference determination module 32. By adding the difference of the parity to the original parity, the new code word is formed. In step 564, parity is modified. As mentioned above, a first set of code words is determined as:

$(d_1, \ldots d_i, \ldots, d_k, p_1, p_2, \ldots, p_{n-k})$ which represents the original information written on the RAID system. If the data written on the i-th drive is modified, the new information on the RAID system has the form $(d_1, \ldots d_i^*, \ldots, d_k, p_1^*, p_2^*, \ldots, p_{n-k}^*)$. Note that besides changing the data on i-th data drive, parity drives also have to be modified. Instead of encoding $(d_1, \ldots d_i, \ldots, d_k)$ directly (this once again would require to read all the data drives), the modified word $(0, 0, \Delta d_i, 0, 0, \ldots 0)$ is encoded to obtain RS ECC codeword $(0, 0, \Delta d_i, 0, 0, \ldots 0, \Delta p_1, \Delta p_2, \ldots, \Delta p_{n-k})$, where $\Delta d_i = d_i + d_i^*$, $\Delta p_1 = p_1 + p_1^*$, $\Delta p_2 = p_2 + p_2^*$, $\ldots$, $\Delta p_{n-k} = p_{n-k} + p_{n-k}^*$. Observe that carrying out symbol-wise addition of original RAID ECC codeword $(d_1, \ldots, d_i, \ldots, d_k, p_1, p_2, \ldots, p_{n-k})$ and difference RS ECC codeword $(0, 0, \Delta d_i, 0, 0, \ldots 0, \Delta p_1, \Delta p_2, \ldots, \Delta p_{n-k})$ gives desired new RS ECC codeword $(d_1, \ldots d_i, \ldots, d_k, p_1, p_2, \ldots, p_{n-k})$ Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A Redundant Array of Inexpensive Disks (RAID) controller, comprising:
    a RAID error correction code (ECC) encoder module that receives data for storage and generates code words for data drives and one or more parity drives, wherein said data drives and said one or more parity drives have physical locations,
    wherein said code words are generated based on said data and a cyclic code generator polynomial, and
    wherein logical locations correspond to index positions in said cyclic code generator polynomial; and
    a mapping module that generates a map of said physical locations of said data drives and said one or more parity drives to said logical locations,
    wherein when one of said data drives is removed, said mapping module and said RAID ECC encoder module refrain from modifying said map.

2. The RAID controller of claim 1, wherein said cyclic code generator polynomial generates Reed Solomon code.

3. The RAID controller of claim 2, wherein said RAID ECC encoder module is configured in erasure decoding mode.

4. The RAID controller of claim 1, wherein before one of said data drives is removed, said RAID ECC encoder module reads said one of said data drives.

5. The RAID controller of claim 4, further comprising a difference generating module that generates a difference code word based on said removed data drive, wherein said RAID ECC encoder adds said difference code word to an original code word generated before said removed data drive is removed.

6. The RAID controller of claim 1, wherein when said removed data drive is removed, said RAID ECC encoder module assigns a zero to a logical location in said code word corresponding to said removed data drive, modifies said parity drives and does not read other ones of said data drives.

7. A RAID system comprising:
    the RAID controller of claim 1;
    K data drives each including an ECC/cyclic redundancy check (CRC) module that performs drive ECC and CRC, where K is an integer greater than one; and
    R parity drives each including an ECC/CRC module that performs drive ECC and CRC, where R is an integer greater than zero.

8. The RAID controller of claim 1, wherein said mapping module maps said one or more parity drives to lowest positions in said index.

9. The RAID controller of claim 1, wherein said RAID ECC encoder module is configured to handle a maximum number of data drives k_max and to have a maximum correction power t_max.

10. The RAID controller of claim 1, further comprising a RAID ECC decoder module that decodes said code words.

11. A Redundant Array of Inexpensive Disks (RAID) controller, comprising:
    RAID error correction code (ECC) encoding means for receiving data for storage and for generating code words for data drives and one or more parity drives, wherein said data drives and said one or more parity drives have corresponding physical locations,
    wherein said code words are generated based on said data and a cyclic code generator polynomial, and
    wherein logical locations correspond to an index of said cyclic code generator polynomial; and
    mapping means for generating a map of said physical locations of said data drives and said one or more parity drives to said logical locations,
    wherein when one of said data drives is removed, said mapping means and said RAID ECC encoder means refrains from modifying said map.

12. The RAID controller of claim 11, wherein said cyclic code generator polynomial generates Reed Solomon code.

13. The RAID controller of claim 12, wherein said RAID ECC encoding means is configured in erasure decoding mode.

14. The RAID controller of claim 11, wherein before one of said data drives is removed, said RAID ECC encoding means reads said one of said data drives.

15. The RAID controller of claim 14,
further comprising difference generating means for generating a difference code word based on said removed data drive, wherein said RAID ECC encoding means adds said difference code word to an original code word generated before said removed drive is removed.

16. The RAID controller of claim 11, wherein when said removed drive is removed, said RAID ECC encoding means assigns a zero to a logical location in said code word corresponding to said removed data drive, modifies said parity drives and does not read other ones of said data drives.

17. A RAID system comprising:
the RAID controller of claim 11;
K data drives each including ECC/cyclic redundancy check (CRC) means for performing drive ECC and CRC, where K is an integer greater than one; and
R parity drives each including ECC/CRC means for performing drive ECC and CRC, where R is an integer greater than zero.

18. The RAID controller of claim 11, wherein said mapping means maps said one or more parity drives to lowest positions in said index.

19. The RAID controller of claim 11, wherein said RAID ECC encoding means is configured to handle a maximum number of data drives k_max and to have a maximum correction power t_max.

20. The RAID controller of claim 11, further comprising RAID ECC decoding means for decoding said code words.

21. A method for operating Redundant Array of Inexpensive Disks (RAID) controller, the method comprising:
receiving data for storage and generating code words for data drives and one or more parity drives, wherein said data drives and said one or more parity drives have corresponding physical locations,
generating said code words based on said data and a cyclic code generator polynomial, and
wherein logical locations correspond to an index of said cyclic code generator polynomial;
generating a map of said physical locations of said data drives and said one or more parity drives to said logical locations; and
refraining from modifying said map when one of said data drives is removed.

22. The method of claim 21, wherein said cyclic code generator polynomial generates Reed Solomon code.

23. The method of claim 22,
further comprising operating in erasure decoding mode.

24. The method of claim 21,
further comprising reading said one of said data drives before one of said data drives is removed.

25. The method of claim 24, further comprising:
generating a difference code word based on said removed data drive; and
adding said difference code word to an original code word generated before said removed data drive is removed.

26. The method of claim 21, further comprising:
when said removed drive is removed:
assigning a zero to a logical location in said code word corresponding to said removed data drive;
modifying said parity drives; and
not reading other ones of said data drives.

27. The method of claim 21, further comprising performing drive ECC and CRC on said data and parity drives.

28. The method of claim 21,
further comprising mapping said parity drives to lowest positions in said index.

29. The Raid controller of claim 1, wherein data in said data drives is accessed after said removal of said one of said data drives based on said map.

30. The Raid controller of claim 4, wherein data in said one or more parity drives is modified based on said reading of said one of said data drives and after said removal of said one of said data drives.

31. The Raid controller of claim 4, further comprising a drive detector module that determines that said one of said data drives is to be removed,
wherein after said determination said RAID ECC encoder module performs said read of said one of said data drives.

* * * * *